United States Patent [19]

Dalmasso

[11] 3,789,341

[45] Jan. 29, 1974

[54] CIRCUIT PACKAGE

[75] Inventor: Claudio Dalmasso, Ivrea, Italy

[73] Assignee: Ing. C. Olivetti & C. S.p.A., Ivrea (Torino), Italy

[22] Filed: Jan. 20, 1972

[21] Appl. No.: 219,419

[30] Foreign Application Priority Data

Jan. 29, 1971 Italy ................................ 67296/71

[52] U.S. Cl.... 339/17 CF, 339/176 M, 174/DIG. 3, 317/101 CC

[51] Int. Cl. .............................................. H05k 1/00

[58] Field of Search.......... 174/52 S, 52 PE, DIG. 3; 317/101 CP, 101 CC, 234 E, 234 F, 234 G; 29/626, 588–590; 262/272; 206/46 R, 46 FR; 339/17 C, 176 M, 17 LM, 17 CF

[56] References Cited

UNITED STATES PATENTS

| | | | |
|---|---|---|---|
| 2,806,188 | 9/1957 | Kastner et al. | 174/52 PE UX |
| 3,575,546 | 4/1971 | Liautaud | 174/52 PE X |
| 3,627,901 | 12/1971 | Happ | 174/DIG. 3 X |
| 3,641,254 | 2/1972 | Bunting et al. | 174/DIG. 3 X |
| 3,700,788 | 10/1972 | Spurck | 174/52 S |

*Primary Examiner*—Darrell L. Clay

[57] ABSTRACT

Disclosed is a circuit package which utilizes a collar member made of injected polysulphone plastic to support an integrated circuit board. The plastic collar has imbedded therein a plurality of terminal leads. The collar and terminal lead arrangement is constructed before the integrated circuit board is attached, thereby allowing the high temperature and pressure injection process to be used to form the support collar. Any plastic which is heavily charged with glass or alumina can be used.

2 Claims, 4 Drawing Figures

PATENTED JAN 29 1974 3,789,341

CIRCUIT PACKAGE

BACKGROUND OF THE INVENTION

Prior art methods of constructing integrated circuit packages usually include, as a final step, the global encapsulation of the package in plastic or epoxy. Prior to encapsulation a package typically consists of the integrated circuit chips mounted at the center of a fragile substrate (usually ceramic); the substrate plate, or integrated circuit board, has deposited thereon a metallization pattern, which pattern forms the electrical communication paths between the integrated circuits and the peripheral edges of the substrate plate. At the edges of the substrate, a group of terminal leads are bound to the metallization pattern; the terminal leads are mechanically relatively strong since they function, not only as the final link in the electrical communication chain, but also as the means for mechanically afixing the package to the external circuit environment. This assembly, consisting of a fragile substrate having peripherally extending metallization deposited thereon, an integrated circuit group centrally located, and terminal leads peripherally afixed, is then globally encapsulated in plastic. The assembly is completely encased in plastic with the exception of the ends of the terminal leads which protrude from the encapsulation and which ends are ultimately bound to the location where the package is to be afixed. The plastic encapsulation is necessary in order to provide a strong mechanical support for the terminal leads. If the leads were not firmly supported, the various shocks and stresses to which the terminal leads are subjected would be communicated directly to the substrate. These stresses could easily fracture the bonds between the terminal leads and the metallization pattern or break the substrate itself.

While global encapsulation provides protection from external mechanical shock, it also introduces its own set of packaging problems. By completely encasing the integrated circuit substrate and a portion of the terminal leads in plastic, there arises the problem of the different rates of expansion due to heating and also the problem of response to humidity. The plastic used in global encapsulation has coefficient of expansion which substantially differs from those of the substrate and the terminal leads; therefore, when the substrate heats due to the operation of the integrated circuits, or when the terminal leads heat due to conditions external to the package, severe internal stresses are created. These internal stresses can cause the terminal lead-metallization bonds to fracture or can break the substrate. The use of global encapsulation to protect the package from external mechanical stresses is, therefore, a highly imperfect solution.

SUMMARY OF THE INVENTION

This invention concerns an integrated circuit package which is strong enough to withstand external shocks and yet is free from internal stress, and, the method of constructing this package. The mechanical support for the terminal leads, which, in the prior art, was usually supplied by a global encapsulant, is provided by a plastic collar member. The terminal leads are imbedded in the plastic collar member before these leads are afixed to the metallization of the substrate. Because the plastic collar is formed about the terminal leads before the leads are afixed to the substrate, the high temperature and pressure injection process can be used to fabricate the plastic collar. The severe conditions imposed during the injection process will not harm the sturdy metal terminal leads; the polysulphone plastic which is formed by the injection process responds to temperature and humidity variations in a way which quite closely corresponds to the terminal lead's response. Therefore the leads will have a firm mechanical support without internal stresses due to changes in temperature and humidity. The collar can be made of injected polysulphone or of any plastic heavily charged with glass or alumina (which charging lowers the thermal coefficient of expansion).

Further strength is attained by bending each lead along a segment of its length. This bent segment is the portion which is to be encased in plastic if maximum strength is to be achieved. By controlling the amount of bend, one can also make the package adaptable to various integrated circuit boards and external circuit environments.

Accordingly, it is an object of this invention to provide a circuit package which is mechanically strong.

It is a further object to make this package compatible with various circuit environments and integrated circuit boards.

It is a further object to make this package free from stress caused by temperature and humidity.

Other objects will appear hereinafter.

DETAILED DESCRIPTION OF THE PREFERRED EMBODIMENT

Figure 1:
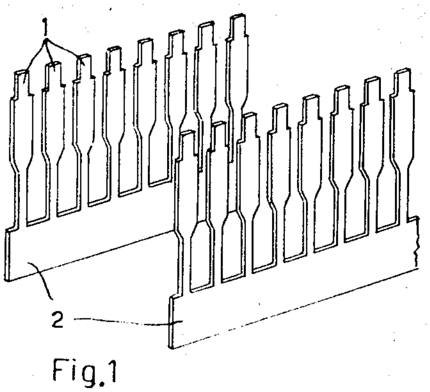
FIG. 1 is an isometric view of the terminal leads.

FIG. 1 depicts the terminal leads 1 in their original state prior to being bent and being imbedded in plastic support. Member 2 is merely a temporary retentive means for holding leads 1 together and at a proper position with respect to each other. Retentive member 2 is removed prior to afixing the lower ends of terminals 1 to a receptor member, e.g. a circuit board (not shown), which board would carry a large number of packages constructed in accordance with this invention. Terminal leads 1 are of a relatively strong metal and, accordingly, can withstand the quite severe shocks and forces to which they will be subjected when the completed package is bound to the aforementioned receptor circuit board. Further, these metal terminal leads will not be damaged during the formation of injected plastic by the harsh injection process which requires extremely high temperatures and pressures.

Figure 3:
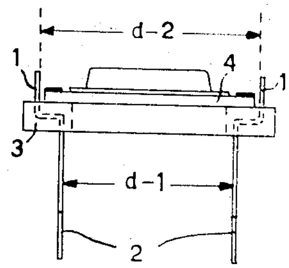
FIG. 3 is a cut-away plan view of the package.
Figure 2:
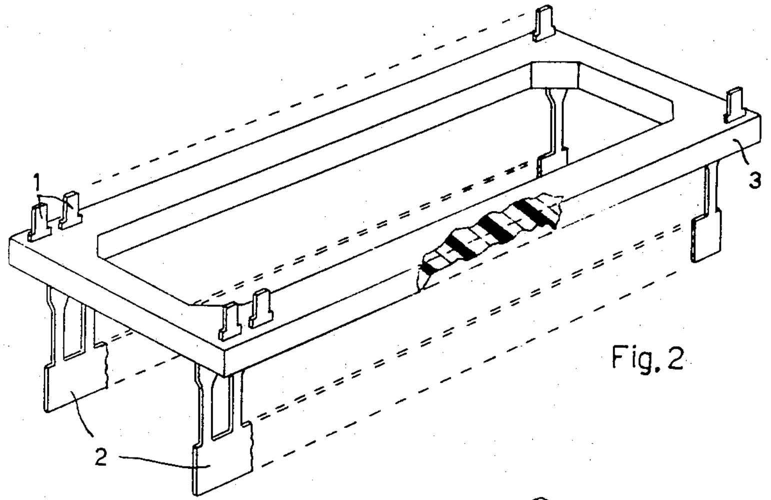
FIG. 2 is an isometric view of the terminal leads imbedded in a support collar of plastic.

FIGS. 2 and 3 show the terminal leads 1 imbedded in plastic support collar 3, which collar is made of injected polysulphone plastic or of plastic charged to 80–150 percent of its weight with glass or alumina. As is best seen in FIG. 3, those segments of leads 1 which are encased in the support collar 3, are bent a substantial amount. There are two advantages which accrue to these bent segments internal to collar 3: first the bent segment encased in plastic adds considerable strength to the package, and second, the distances *d*–1 and *d*–2 (FIG. 3) can be varied by altering the shape of the bent segments of the leads 1. The fact that *d*–1 and *d*–2 can be varied easily and inexpensively is quite important.

Figure 4:
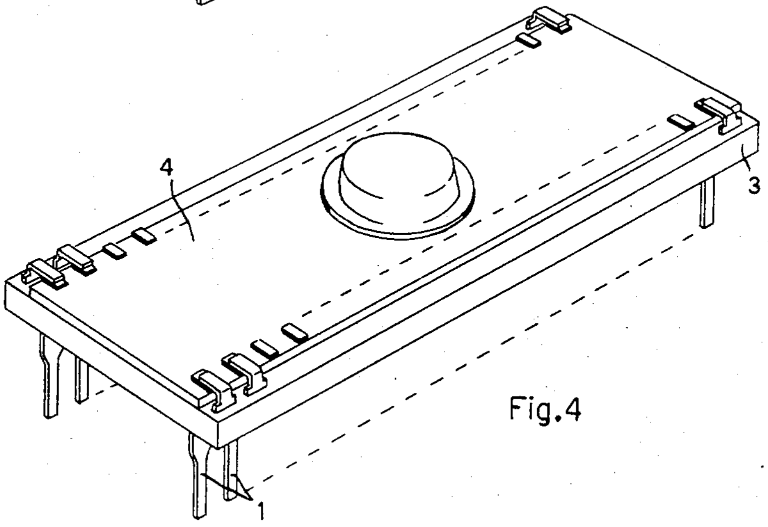
FIG. 4 is an isometric view of the completed package.

This variability is important because the integrated circuit substrate 4 (FIGS. 3 and 4) can be of various widths. Integrated circuit substrates 4 are purchased by some manufacturing concerns in a ready-made state; that is, the substrates are not necessarily tailor-made to the needs of each purchaser. These substrates, if purchased from different sources, can be, and usually are, of different sizes. The purchaser can merely alter the degree of curvature of the bent segments of leads 1, prior to the formation of the collar, to alter the distance *d*–2, thereby allowing a substrate of different width to be accomodated. The lower portions of terminal leads 1 are ultimately plugged into a receptor circuit board (not shown). These circuit boards, like the substrates 4, can vary in specification; that is, the distance *d*–1 can vary. Again, by varying the degree of curvature of the bent segment of leads 1, these various circuit boards can be utilized. It is only necessary to determine the desired distances *d*–1 and *d*–2, appropriately bend and position terminal leads 1, and then form the plastic support collar 3 about the bent segments. Therefore, one can use the same terminal leads and plastic injection apparatus to create strong terminal lead arrangements capable of accomodating various integrated circuit substrates and capable of being accomodated by various circuit boards.

Support collar 3 is, in this preferred embodiment, made of polysulphone plastic formed by the well known injection process. The high temperature and pressure injection process can be used since only the sturdy terminal leads are subjected to the drastic temperatures and pressures. The fragile integrated circuit substrate 4 (together with the integrated circuits and the appropriate metallization carried by the substrate) never comes in contact with the plastic forming process; substrate 4 (FIGS. 3 and 4) is placed on a shoulder of support collar 3 after the collar has been formed.

While epoxy and conventional plastics have coefficients of thermal expansion which are quite different from those of the metal terminal leads and the ceramic substrate, the polysulphone formed by injection matches the coefficient of the leads quite adequately. Accordingly, the package will be more reliable since there is a reduced risk of damage causing stress caused by heat variations.

After the terminal leads 1 have been appropriately bent and the support collar 3 has been formed the integrated circuit substrate is placed on the inner ledge, or shoulder, of the collar (FIG. 3), and the top portions of the terminal leads are connected to the substrate metallization. Temporary retentive means 2 (FIG. 1) is then removed and the package is ready to be plugged into the external circuit environment.

I claim:

1. A circuit package mounting an integrated circuit board to a receptor member including:

two sets of terminal leads, a first end of each lead of each set connectable to said integrated circuit board and a second end of each lead of each set connectable to said receptor member, said two sets of leads being disposed substantially parallel to each other with each lead of each set having a bent segment along its length so that the distance between said first ends of each set is different from the distance between said second ends of each set;

a plastic support collar means formed about said terminal leads at said bent segment along their length for supporting said parallel sets of terminal leads and said integrated circuit board.

2. A circuit package for mounting an integrated circuit board on a receptor member comprising:

a plastic support collar having a surface for receiving said integrated circuit board, a plurality of terminal leads arranged in two opposed spaced sets, each of said leads comprising first and second end portions joined by an intermediate portion, each said lead having a first bend at the juncture of said first end portion and said intermediate portion and a second bend at the juncture of said second end portion and said intermediate portion, said first and second bends being oppositely oriented so that said first end portion and said second end portion are disposed in spaced, substantially parallel planes, the spacing between said first end portion of said opposed sets accommodating said integrated circuit board and the spacing between said second end portion of said opposed sets accommodating said receptor, said intermediate portion, said first and second bends, and portions of said first and second end portions immediately adjacent to said bends being embedded in said support collar, with said first end portions extending above said surface to be connectable to said integrated circuit board.

* * * * *